United States Patent [19]

Matsubara

[11] Patent Number: 5,764,585
[45] Date of Patent: Jun. 9, 1998

[54] SEMICONDUCTOR MEMORY DEVICE HAVING MAIN WORD LINES AND SUB WORD LINES

[75] Inventor: Yasushi Matsubara, Tokyo, Japan

[73] Assignee: NEC Corporation, Tokyo, Japan

[21] Appl. No.: 660,281

[22] Filed: Jun. 7, 1996

[30] Foreign Application Priority Data

Jun. 7, 1995 [JP] Japan ..................... 7-140325

[51] Int. Cl.⁶ .................................... G11C 8/00
[52] U.S. Cl. ..................... 365/230.06; 365/51
[58] Field of Search ................. 365/230.06, 51, 365/63, 230.03

[56] References Cited

U.S. PATENT DOCUMENTS

| | | | |
|---|---|---|---|
| 5,416,748 | 5/1995 | Fujita | 365/230.06 |
| 5,463,577 | 10/1995 | Oowaki | 365/63 |
| 5,506,816 | 4/1996 | Hirose | 365/230.06 |
| 5,519,665 | 5/1996 | Chishiki | 365/230.06 |
| 5,581,508 | 12/1996 | Sasaki | 365/230.06 |

FOREIGN PATENT DOCUMENTS 62-28516  6/1987  Japan.
5-182461  7/1993  Japan.

*Primary Examiner*—David C. Nelms
*Assistant Examiner*—Son Mai
*Attorney, Agent, or Firm*—Sughrue, Mion, Zinn, Macpeak & Seas, PLLC

[57] ABSTRACT

In a DRAM device including a plurality of main row decoders and a plurality of sub row decoders, each of the main row decoders is connected to only one main word line. Each of the sub row decoders is connected to one main word line and a plurality of sub word lines. One or more of the sub word lines are activated in accordance with the activated main word line and the sub row decoders.

10 Claims, 9 Drawing Sheets

SEMICONDUCTOR MEMORY DEVICE HAVING MAIN WORD LINES AND SUB WORD LINES

BACKGROUND OF THE INVENTION

1. Field of the Invention

The present invention relates to a semiconductor memory device, and more particularly, to a dynamic random access memory (DRAM) device having main word lines and sub word lines.

2. Description of the Related Art

As DRAM devices have been highly-integrated, the access speed has been reduced. In order to enhance the access speed, bits of row address are divided into two groups, to drive word lines (see JP-A-58-211393 and JP-A-5-182461).

A prior art DRAM device includes a plurality of main row decoders each connected to two main word lines, and a plurality of sub row decoders each connected to one of the main word lines and a plurality of sub word lines. Therefore, one of the main word lines is activated by the main row decoders, and one or more sub word lines are activated in accordance with the activated main word line and the sub row decoders, thus completing a row selection operation. This will be explained later in detail.

In the above-described prior art DRAM device, however, only one of the main word lines is required to be activated for row selection, two of the main word lines are activated, thus reducing the enhancement of the access speed.

SUMMARY OF THE INVENTION

It is an object of the present invention to further enhance the access speed of a semiconductor memory device.

According to the present invention, in a DRAM device including a plurality of main row decoders and a plurality of sub row decoders, each of the main row decoders is connected to only one main word line. Each of the sub row decoders is connected to one main word line and a plurality of sub word lines. One or more of the sub word lines are activated in accordance with the activated main word line and the sub row decoders. Thus, the load of the main row decoders is reduced, thus enhancing the access speed.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiment, a prior art DRAM device will be explained with reference to FIGS. 1, 2 and 3.

Figure 1:
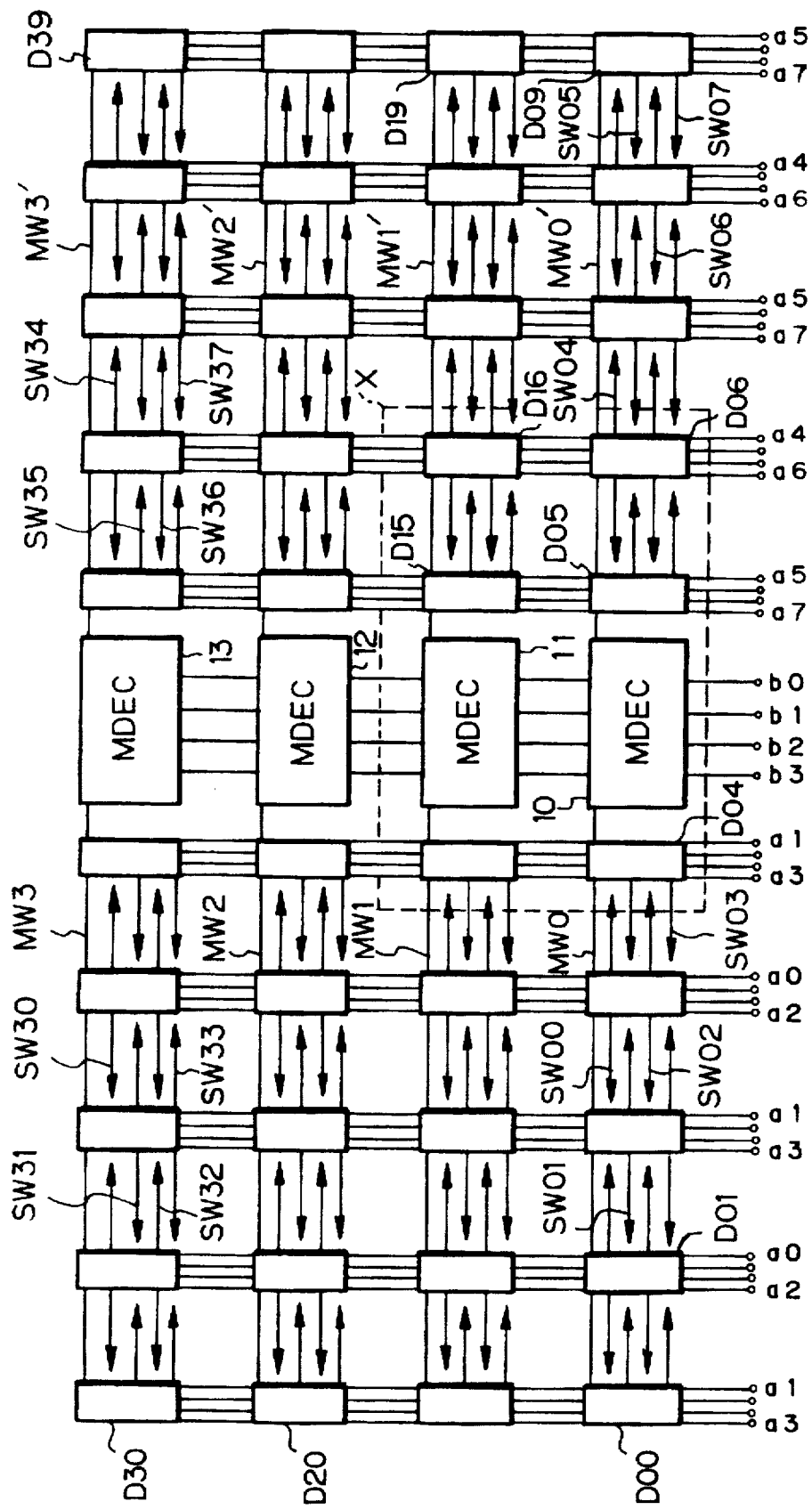
FIG. 1 is a block circuit diagram illustrating a prior art DRAM device.

In FIG. 1, which illustrates a prior art DRAM device, each of four main row decoders 10, 11, 12, and 13 are connected to two main word lines MW0, MW0'; MW1, MW1'; MW2, MW2'; and MW3, MW3'. That is, the main row decoders 11, 12, 13 and 14 receive four row predecoding signals b0, b1, b2 and b3, so that one pair of the main word lines MW0, MW0'; MW1, MW1'; MW2, MW2'; and MW3, MW3' selected.

Each of the main word lines MW0, MW0', . . . , MW3, MW3' is connected to five sub row decoders such as D00, D01, . . . , D04. Also, each of the sub row decoders D00, D01, . . . , D39 receives two of predecoding row signals a0, a1, . . . , a7 and is connected to two sub word lines. For example, the sub row decoder D00 receives the predecoding row signals a1 and a3 and is connected to the sub word lines SW01 and SW03. Therefore, when the main word line MW0 is active and the predecoding row signal a1 is active, the sub word line SW01 is selected.

Figure 3:
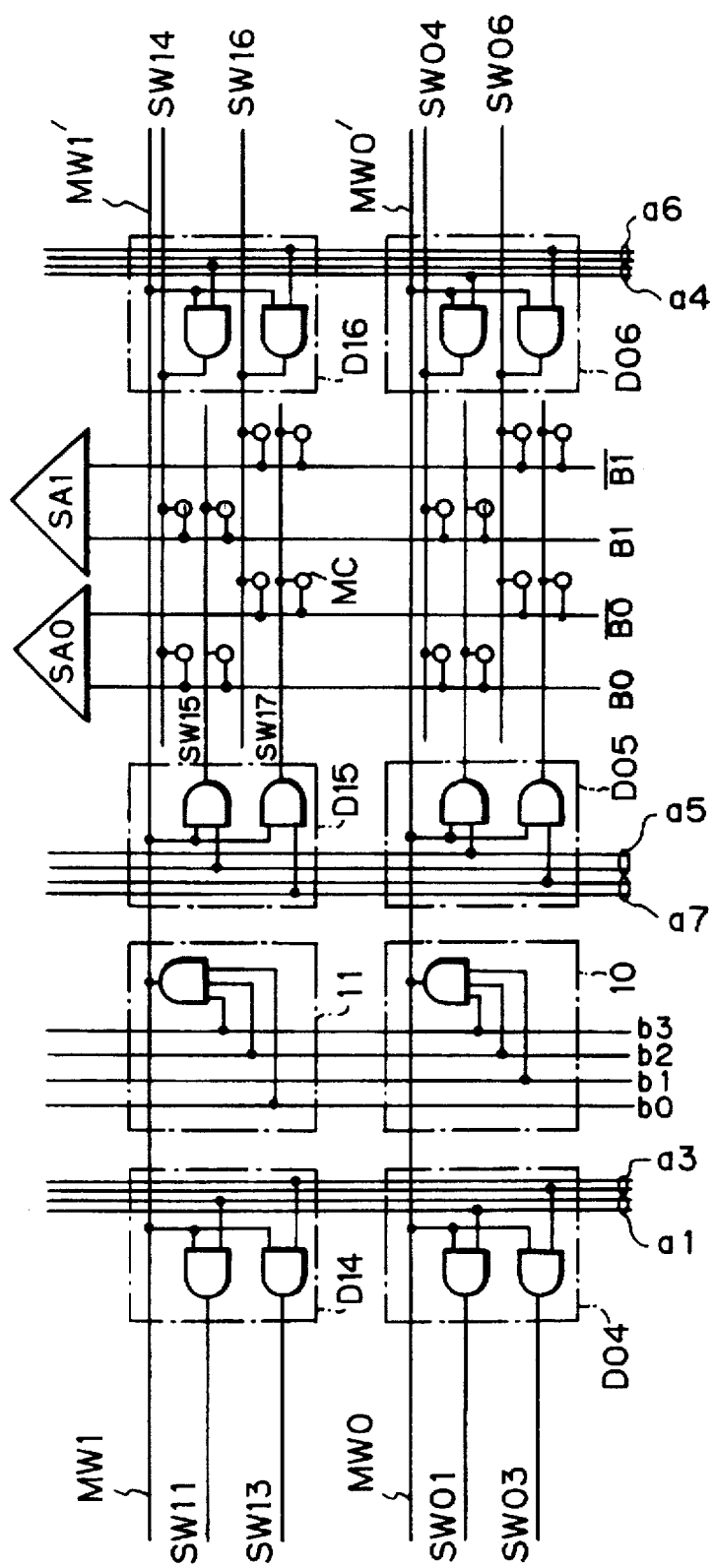
FIG. 3 is a partial detailed circuit diagram of the device of FIG. 1.

Also, provided between the sub row decoders D00, D01, . . . , D39 are memory cell arrays of a one-transistor, one-capacitor type (shown not in FIG. 1, but in FIG. 3).

Figure 2:
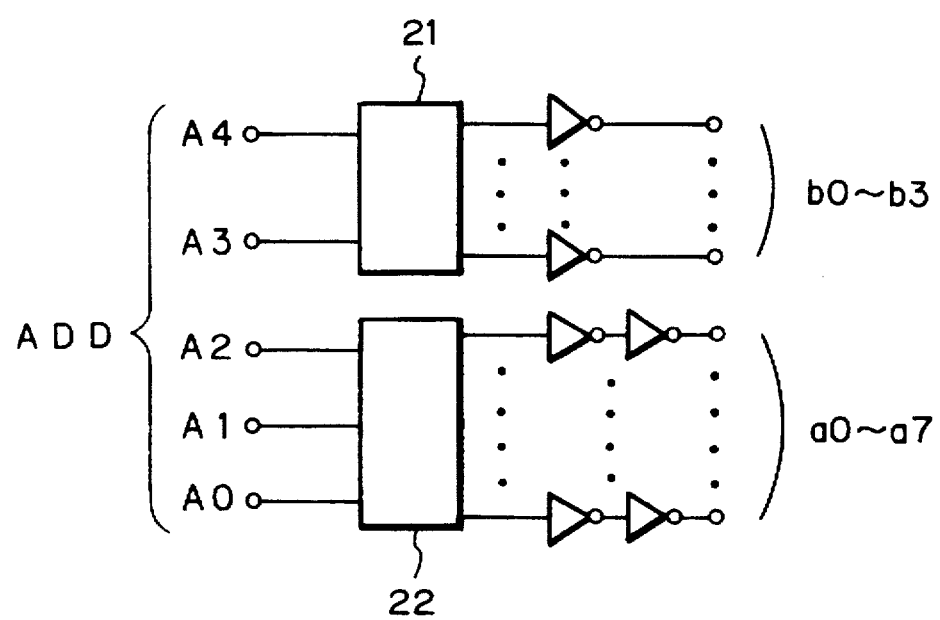
FIG. 2 is a block circuit diagram of the predecoders for generating the predecoding row signals of FIG. 1.

With reference to FIG. 2, the predecoding row signals b0 to b3 and the predecoding row signals a0 to a7 are generated by predecoders 21 and 22. That is, the predecoder 21 receives two upper bits A3 and A4 of an external row address signal ADD to generate the four(=$2^2$) predecoding row signals, b0 to b3. Similarly, the predecoder 22 receives three lower bits A0, A1 and A2 of the external row address signal ADD to generate the eight(=$2^3$) predecoding row signals a0 to a7.

In FIG. 3, which is a partial detailed circuit diagram of the device of FIG. 1, each of the main row decoders 10 and 11 is comprised of an AND circuit which receives three of the predecoding row signals b0, b1, b2 and b3. Also, the sub row decoder such as D05 is comprised of an AND circuit for receiving a signal on the main word line MW0 and the predecoding row signal a5 and an AND circuit for receiving the signal on the main word line MW0 and the predecoding row signal a7.

Also, two pairs of bit lines B0 and $\overline{B0}$, B1 and $\overline{B1}$ intersect the sub word lines such as SW04 and SW06. Provided at each intersection between the sub word lines and the bit lines is a memory cell MC of a one transistor, one-capacitor type. Further, each pair of the bit lines such as B0 and $\overline{B0}$ are connected to a sense amplifier SA0.

In FIGS. 1 and 3, each of the predecoding row signals a0, a1, . . . , a7 is supplied via two signal lines to the sub row decoders D00, D01, . . . , D39. For example, the predecoding row signals a5 and a7 are supplied to the sub row decoders D05 and D15. In this case, the sub row decoders D05 and D15 receive the predecoding row signals a5 and a7 through different signal lines. If each of the predecoding row signals a0, a1, . . . , a7 is supplied via one signal line to the sub row decoders, the load of the signal line is remarkably increased to reduce the access speed.

For example, when the main row decoder 10 is activated by the predecoding row signals b0, b1, b2 and b3 so that the voltage at the main word line MW0 is high, and the predecoding row signal a0 is made high, four of the sub word lines SW00 are selected.

In the prior art device as illustrated in FIGS. 1, 2 and 3, in order to activate the memory cell array on the left side of the main row decoders 10, 11, 12 and 13, the main word line such as MW0 and the predecoding row signal such as a0 are made high. In this case, however, the main word line MW0' is made high, although the memory cell arrays on the right side of the main row decoders 10, 11, 12, and 13 are not activated at all. Thus, the load of the main word lines is remarkably increased to reduce the access speed.

Figure 4:
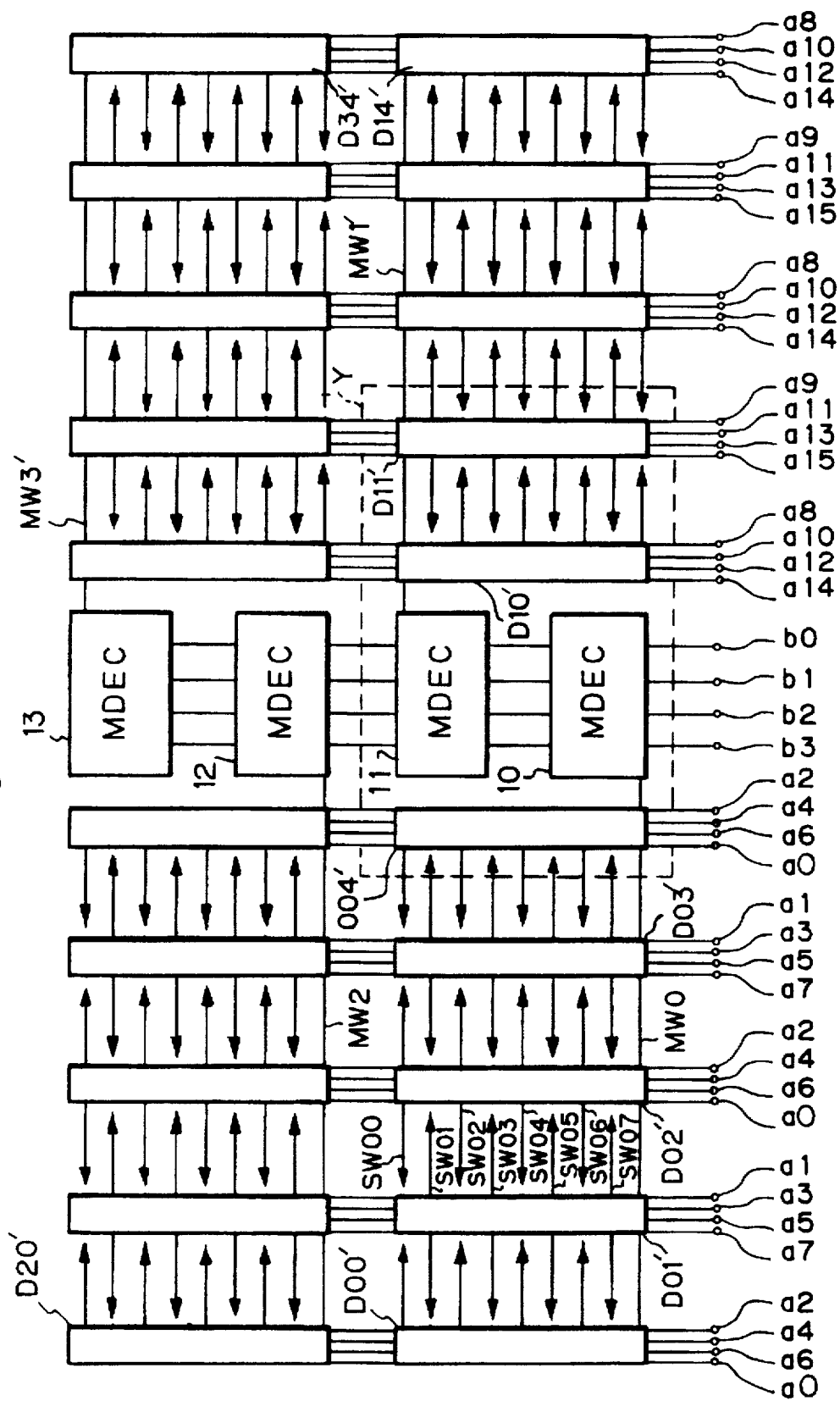
FIG. 4 is a block circuit diagram illustrating an embodiment of the DRAM device according to the present invention.

In FIG. 4, which illustrates an embodiment of the present invention, each of the main row decoders 10, 11, 12 and 13 is connected to only one main word line. That is, the main word lines NW0', MW1, MW2' and MW3 of FIG. 1 are not present.

Each of the main word lines MW0, MW1', MW2, MW3' is connected to five sub row decoders such as D00', D01', . . . , D04'. Also, each of the sub row decoders D00', D01', . . . , D34' receives four of predecoding row signals a0, a1, . . . , a15 and is connected to four sub word lines. For example, the sub row decoder D00' receives the predecoding row signals a0, a2, a4 and a6 and is connected to the sub word lines SW00, SW02, SW04 and SW06. Therefore, when the main word line MW0 is active and the predecoding row signal a0 is active, the sub word line SW00 is selected.

Figure 6:
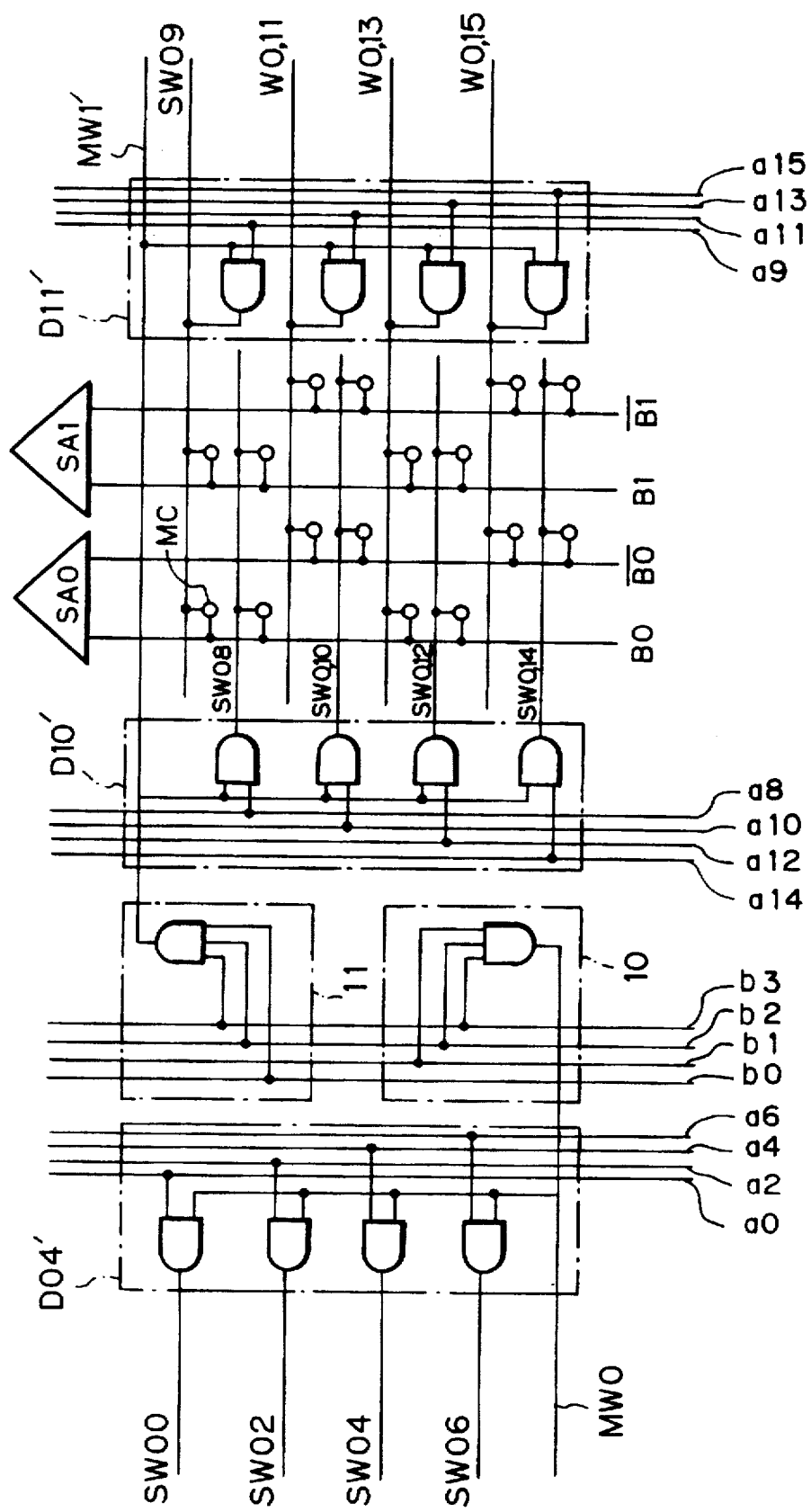
FIG. 6 is a partial detailed circuit diagram of the device of FIG. 4.

Also, provided between the sub row decoders D00', D01', . . . , D34' are memory cell arrays of a one-transistor, one-capacitor type (shown not in FIG. 4, but in FIG. 6).

Figure 5:
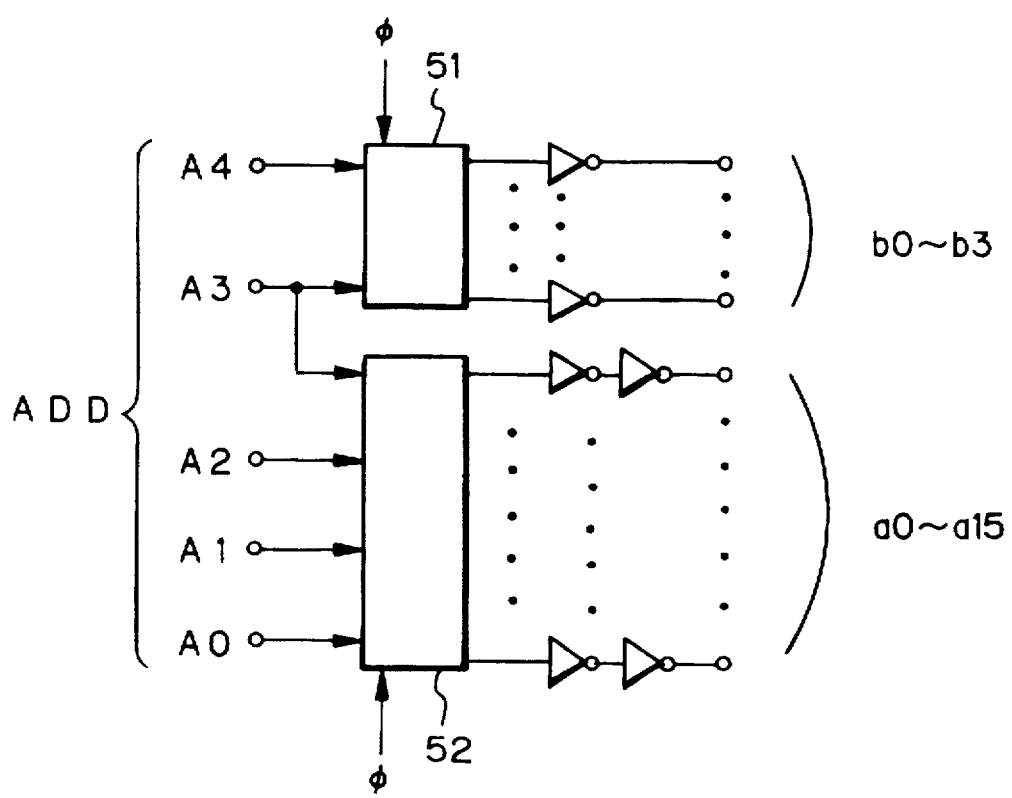
FIG. 5 is a block circuit diagram of the predecoders for generating the predecoding row signals of FIG. 4.

Referring to FIG. 5, the predecoding row signals b0 to b3 and the predecoding row signals a0 to a15 are generated by predecoders 51 and 52. That is, the predecoder 51 receives two upper bits A3 and A4 of the external row address signals ADD to generate the four ($=2^2$) predecoding signals b0 to b3. Similarly, the predecoder 52 receives four lower bits A0, A1, A2 and A3 of the external row address signals ADD to generate the sixteen ($=2^4$) predecoding signals a0 to a15. That is, the bit A3 of the row address ADD is supplied to both predecoders 51 and 52. Also, a precharge signal $\phi$ is supplied to the predecoders 51 and 52. When the precharge signal $\phi$ is low during a precharging time period, all the predecoding row signals b0 to b3 and a0 to a15 are made low. Referring to FIG. 6, the sub row decoder such as D10' includes four AND circuits each for receiving the signal on the main word line MW1' and one of the predecoding row signals a8, a10, a12 and a14.

In FIGS. 4 and 6, each of the predecoding row signals a0, a1, . . . , a15 is supplied via a single signal line to the sub row decoders D00', D01, . . . , D34'. In this case, the number of AND circuits for one predecoding row signal such as a0 is 4 or 6 in FIG. 6, and the number of AND circuits for one predecoding row signal such as a0 is 4 or 6 in FIG. 3. Therefore, the load of the predecoding row signals a0 to a15 of FIGS. 4 and 6 is the same as that of the predecoding row signals a0 to a7 of FIGS. 1 and 3. Therefore, although the number of the predecoding row signals for the sub row decoders in FIGS. 4 and 6 is twice that of the predecoding row signals for the sub row decoders in FIGS. 1 and 3, the number of signal lines is the same as in FIGS. 1 and 4.

Figure 7:
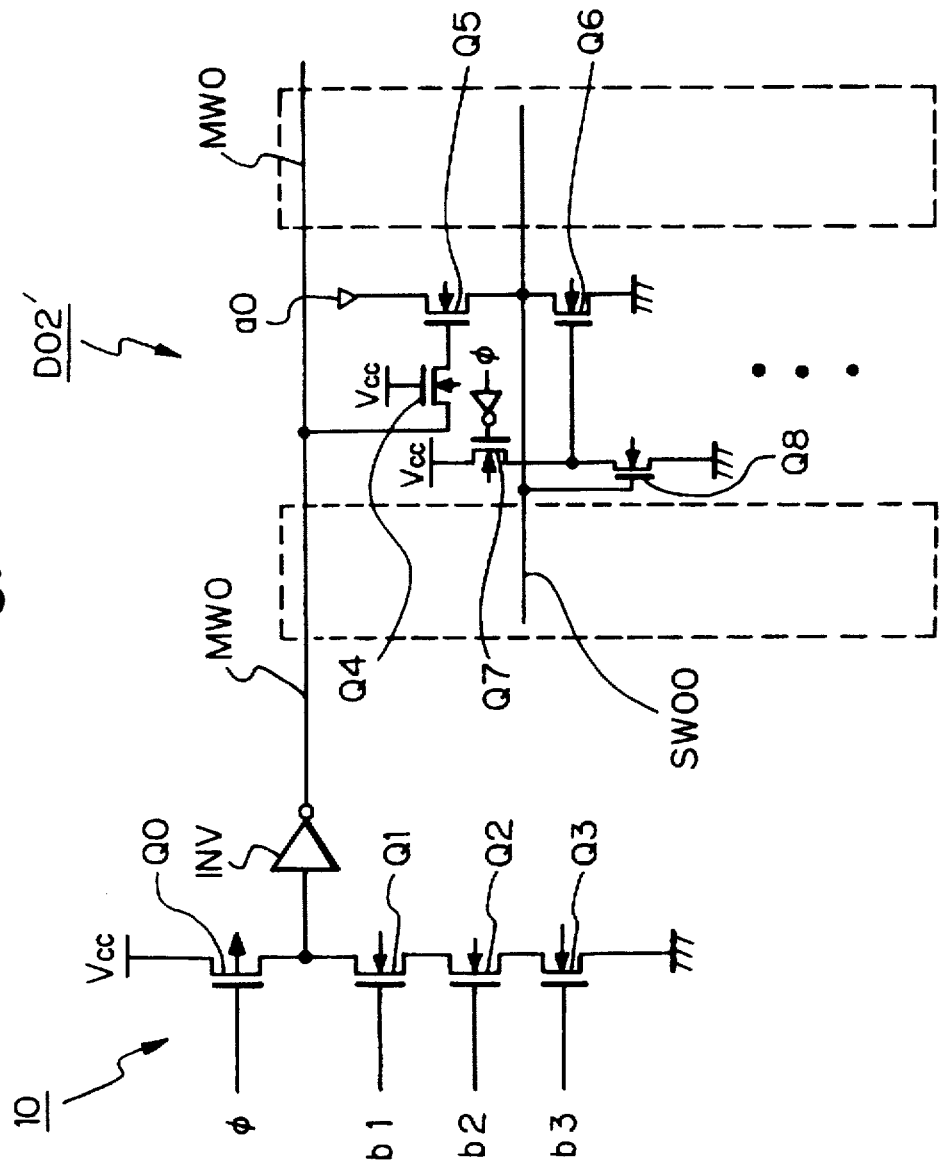
FIGS. 7 is a circuit diagram of a first example of the main row decoder and the sub row decoder of FIG. 6.

FIG. 7 illustrates an example of the main row decoder such as 10 and the sub row decoder such as D02' of FIG. 6. The main row decoder 10 includes a P-channel MOS transistor Q0 for receiving the precharge signal $\phi$, N-channel MOS transistors Q1, Q2 and Q3 for receiving the predecoding row signals b1, b2 and b3, respectively, and an inverter INV, to form an AND circuit. On the other hand, the sub row decoder D02' includes a pull-up N-channel MOS transistor Q4 connected to a gate of an N-channel MOS transistor Q5 for passing the predecoding row signal to the sub word line SW00. Also, N-channel MOS transistors Q6, Q7 and Q8 are provided to completely reduce the voltage at the sub word line SW00 to the ground during a precharge time period ($\phi$=low)

Figure 8:
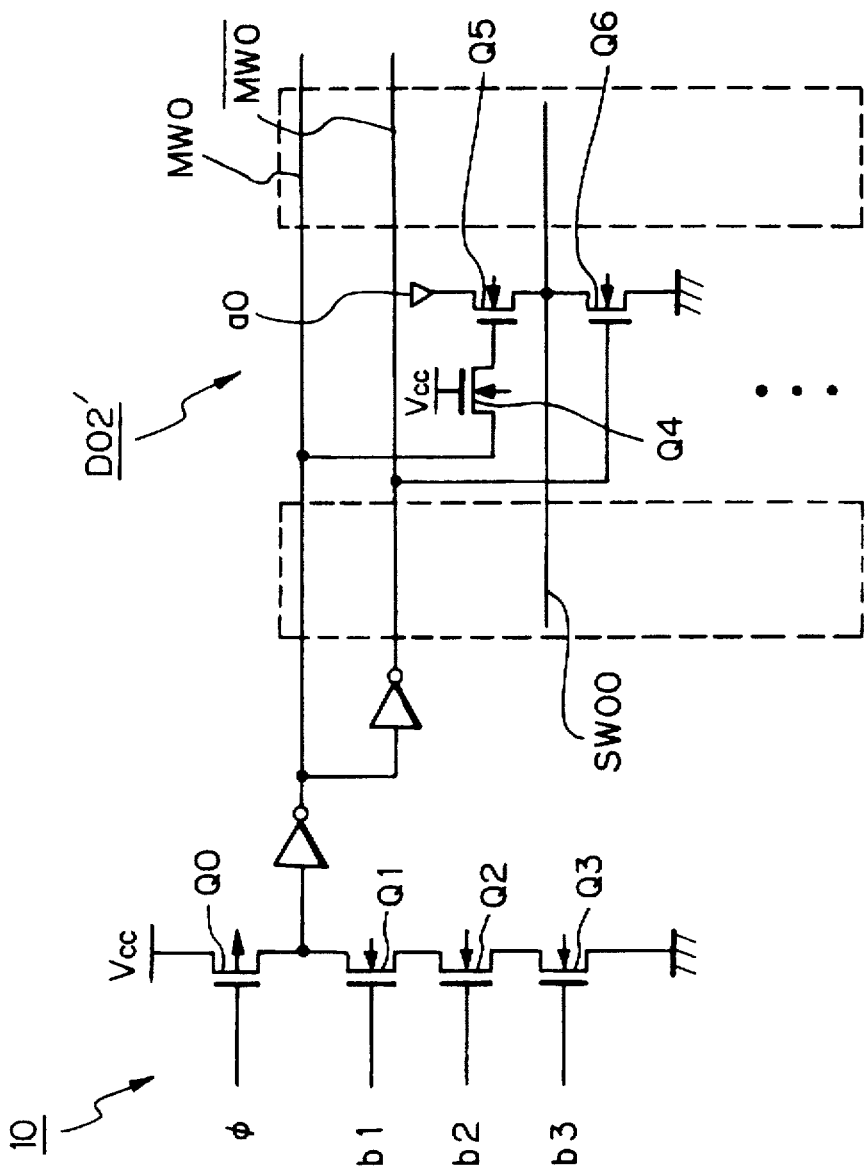
FIG. 8 is a circuit diagram of a second example of the main row decoder and the sub row decoder of FIG. 6.

In FIG. 8, which is a modification of the circuit of FIG. 7, the transistors Q7 and Q8 of FIG. 7 are deleted, and the gate voltage of the transistor Q6 is controlled by an inverted signal of the main word line MW0.

Note that a dotted portion in FIGS. 7 and 8 indicates a memory cell array.

The operation of the device of FIGS. 4, 5, 6 and 7, and 8 is explained next.

Before the external row address ADD is supplied, the precharge signal $\phi$ is made low. As a result, the voltages at all the main word lines MW0, MW1', MW2 and MW3' are low. In this case, in FIG. 7, the transistor Q7 is turned ON, so that the transistor Q6 is turned ON, and, also in FIG. 8, the transistor Q6 is turned ON. Therefore, the voltages at all the sub word lines SW00, . . . are low.

Next, when the precharge signal $\phi$ is changed from low to high, one of the predecoding signals b0 to b3 is made low and the others are made high by the predecoder 51 in accordance with the two upper bits A3 and A4. On the other hand, one of the predecoding signal a0 to a15 is made high and the others are made low by the predecoder 52 in accordance with the lower bits, a0, a1, a2 and a3.

For example, when the predecoding row signal b0 is low, the main word line MW0 is made high and the other main word lines MW1', MW2 and MW3' are made low. As a result, in the sub row decoders D00', D01', . . . , D04' connected to the main word line MW0, the gate voltages of the transistors Q5 are higher than $V_{CC}$ by the self-boot effect, and accordingly, all the transistors Q5 are in an ON state. Therefore, the voltages of the predecoding row signals a0 to a7 are transferred to the sub word lines SW00 to SW07. For example, if the predecoding row signal a0 is high, four of the sub word lines SW00 are selected and made high. Thus, a reading or writing operation is performed upon a memory cell connected to the sub word line SW00.

Thus, since the main row decoder is connected to only one main word line, the load of the main word lines can be reduced to enhance the access speed.

Figure 9:
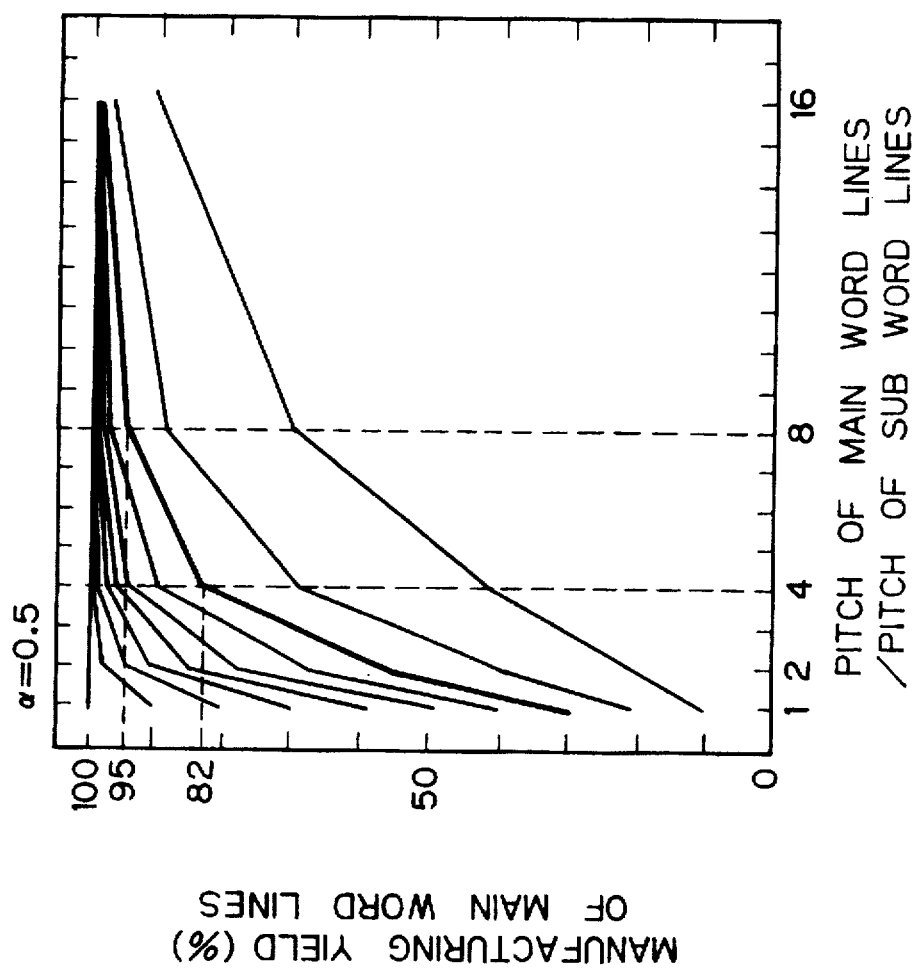
FIG. 9 is a graph showing the manufacturing yield of main word lines of the present invention and the prior art.

Also, since the main word lines are staggered with respect to the main row decoders, the pitch of the main word lines can be increased twice as compared with the prior art, which enhances the manufacturing yield. That is, generally, the main word lines are made of an upper aluminum layer. However, as the integration has been advanced so that a step between a memory cell array area and a peripheral area has been made large, the exposure margin particularly for the upper aluminum layer has been decreased. Therefore, it is impossible to reduce the pitch of the main word lines. Thus, the increased pitch of the main word lines contributes to the enhancement of the manufacturing yield of the main word lines. FIG. 9 shows a relationship between the ratio of the pitch of main word lines to that of sub word lines under the condition that the manufacturing yield of DRAMs after the formation of lowest aluminum layers is 50% ($\alpha$=0.5). Assume that, when the ratio of the pitch of main word lines to that of sub word lines is 1, the manufacturing yield of main word lines is 30%. In the prior art, the ratio of the pitch of main word lines to that of sub word lines is 4 (four sub word line per one main word line), so that the manufacturing yield of main word lines is 82%. On the other hand, in the above-described embodiment, the ratio of the pitch of main word lines to that of sub word lines is 8 (eight sub word line per one main word line), so that the manufacturing yield of main word lines is 95%.

As explained hereinabove, according to the present invention, since the load of main word lines is remarkably reduced, the access speed can be enhanced.

I claim:

1. A semiconductor memory device comprising:

a plurality of main row decoders; and a plurality of main word lines, each of said plurality of main word lines connected to only one side of one of said plurality of main row decoders, wherein said each of said plurality of main row decoders activates only one of said plurality of main word lines in accordance with a first part of a row address; and wherein said main word lines are staggered with respect to said main row decoders.

2. A semiconductor memory device comprising:

a plurality of main row decoders; and a plurality of main word lines, each of said plurality of main word lines connected to only one side of one of said plurality of main row decoders, wherein said each of said plurality of main row decoders activates only one of said plurality of main word lines in accordance with a first part of a row address;

a plurality of sub word lines; and a plurality of sub row decoders, each of said plurality of sub row decoders connected to one of said plurality of main word lines and a group of said sub word lines, for activating one of the group of said sub word lines in accordance with a second part of said row address when the one of said main word lines is activated by the first part of said row address; and wherein the first and second parts of said row address include a common bit of said row address.

3. A semiconductor memory device comprising:

first and second main word lines; and first and second main row decoders, connected to said first and second main word lines respectively, for activating one of said first and second main word lines in accordance with a first part of a row address, said first main word line being positioned along a first direction with respect to said first and second main row decoders, said second main word line being positioned along a second direction different from said first direction with respect to said first and second main row decoders.

4. The device as set forth in claim 3, wherein said second direction is opposite to said first direction.

5. The device as set forth in claim 3, further comprising:

first and second groups of sub word lines;

a first sub row decoder, connected to said first main word line and said first group of sub word lines, for activating one of said first group of sub word lines in accordance with a second part of said row address when said first main word line is activated; and a second sub row decoder, connected to said second main word line and said second group of sub word lines, for activating one of said second group of sub word lines in accordance with the second part of said row address when said second main word line is activated.

6. The device as set forth in claim 5, wherein the first and second parts of said row address include a common bit of said row address.

7. A semiconductor memory device comprising:

a first predecoder for receiving a first part of a row address to generate first predecoding signals;

a second predecoder for receiving a second part of said row address, said first and second parts having a common bit of said row address;

a plurality of main row decoders; and a plurality of main word lines, each of said plurality of main word lines connected to only one side of one of said plurality of main row decoders, said main row decoders activating only one of said main word lines in accordance with said first predecoding signals;

a plurality of sub word lines; and a plurality of sub row decoders, each connected to one of said plurality of main word lines and a group of said sub word lines, for activating one of the group of said sub word lines in accordance with said second predecoding signals when the one of said main word lines is activated by said first predecoding signals.

8. The device as set forth in claim 7, wherein said main word lines are staggered with respect to said main row decoders.

9. A semiconductor memory device comprising:

a plurality of main row decoders;

a plurality of main word lines, each of said plurality of main word lines connected to a respective one of said plurality of main row decoders on only one side of said respective main row decoder to provide a one-to-one correspondence between said main row decoders and said main word lines, wherein said each of said plurality of main row decoders activates only said respective one of said plurality of main word lines in accordance with a first part of a row address, and wherein said main word lines are staggered with respect to said main row decoders.

10. A semiconductor memory device comprising:

a plurality of main row decoders;

a plurality of main word lines, each of said plurality of main word lines connected to a respective one of said plurality of main row decoders on only one side of said respective main row decoder to provide a one-to-one correspondence between said main row decoders and said main word lines, wherein said each of said plurality of main row decoders activates only said respective one of said plurality of main word lines in accordance with a first part of a row address;

a plurality of sub word lines; and a plurality of sub row decoders, each of said plurality of sub row decoders connected to one of said plurality of main word lines and at least one of said plurality of sub word lines for activating said at least one sub word line in accordance with a second part of said row address when the one of said main word lines is activated by the first part of said row address, wherein the first and second parts of said row address includes a common bit of said row address.

* * * * *